(12) United States Patent  
Yu (10) Patent No.: US 9,859,859 B2
(45) Date of Patent: Jan. 2, 2018

(54) SOUND-EFFECT SETTING METHOD AND ELECTRONIC DEVICE

(71) Applicant: AUTOCHIPS INC., Hefei, Anhui Province (CN)

(72) Inventor: Jingjian Yu, Hefei (CN)

(73) Assignee: AUTOCHIPS INC., Hefei, Anhui Province (CN)

( * ) Notice: Subject to any disclaimer, the term of this patent is extended or adjusted under 35 U.S.C. 154(b) by 155 days.

(21) Appl. No.: 14/828,493

(22) Filed: Aug. 17, 2015

(65) Prior Publication Data

US 2016/0065159 A1 Mar. 3, 2016

(30) Foreign Application Priority Data

Aug. 28, 2014 (CN) .......................... 2014 1 0432271

(51) Int. Cl.
 *H03G 5/16* (2006.01)
 *G06F 3/16* (2006.01)
 *G10H 1/00* (2006.01)
 *H03G 5/02* (2006.01)
 *G10L 21/02* (2013.01)
 *G10L 19/00* (2013.01)

(52) U.S. Cl.
 CPC ............ *H03G 5/165* (2013.01); *G06F 3/165* (2013.01); *G10H 1/0091* (2013.01); *H03G 5/025* (2013.01); *G10H 2240/251* (2013.01); *G10L 19/00* (2013.01); *G10L 21/02* (2013.01)

(58) Field of Classification Search
 None
 See application file for complete search history.

(56) References Cited

U.S. PATENT DOCUMENTS

| | | | |
|---|---|---|---|
| 8,473,083 B1 * | 6/2013 | Emigh | H03G 5/005 381/103 |
| 9,602,929 B2 * | 3/2017 | Lindahl | H04R 5/04 |
| 2002/0035407 A1 | 3/2002 | Ishito et al. | |
| 2004/0225388 A1 | 11/2004 | Zhang et al. | |
| 2010/0013996 A1 * | 1/2010 | Kang | H04N 5/445 348/553 |
| 2011/0080522 A1 * | 4/2011 | Hardacker | H04N 9/8233 348/576 |
| 2017/0006351 A1 * | 1/2017 | Haberman | H04N 21/482 |

FOREIGN PATENT DOCUMENTS

| | | |
|---|---|---|
| CN | 101141644 A | 3/2008 |
| CN | 101677377 A | 3/2010 |

* cited by examiner

*Primary Examiner* — Paul Huber
(74) *Attorney, Agent, or Firm* — Cheng-Ju Chiang (57) ABSTRACT

A sound-effect setting method and an electronic device are provided. The sound-effect setting method comprises decoding an audio data stream; performing sound-effect processing on the decoded audio data stream according to a sound-effect parameter to obtain sound-effect processed audio data; encoding the sound-effect processed audio data to obtain encoded data and outputting the encoded data and the sound-effect parameter. When the audio playing is switched from the current apparatus to the external apparatus, the sound-effect coordination is achieved, and the problem that the playing effect will become poor if there is no sound-effect coordination is prevented.

19 Claims, 7 Drawing Sheets

SOUND-EFFECT SETTING METHOD AND ELECTRONIC DEVICE

CROSS-REFERENCE OF RELATED APPLICATIONS

This application is based upon and claims the benefit of priority from the prior Chinese Patent Application No. 201410432271.4, filed on Aug. 28, 2014, the entire contents of which are incorporated herein by reference.

FIELD OF THE INVENTION

The present disclosure generally relates to the technical field of audio technologies, and more particularly, to a sound-effect setting method and an associated electronic device.

BACKGROUND OF THE INVENTION

In order to improve the audio experience of a multimedia apparatus, the multimedia apparatus generally has a number of sound-effect settings, e.g., EQ, Reverb, Upmix, etc. These sound-effect settings provide many setting options to satisfy different needs of customers.

In practical use, when a music being played by a user is switched from one multimedia apparatus to another, the user's experience might be degraded. For example, the music is being played in a "Rock" equalization mode via a mobile phone. when the user gets on a car, the music will be played by an on-board multimedia apparatus instead. If the on-board multimedia apparatus plays music in a "Jazz" equalization mode, the playing effect will necessarily become poorer if there is no sound-effect coordination between the two apparatuses after the music playing being switched from the mobile phone to the on-board multimedia apparatus, and this will degrade the user's experience. Especially, for specific music, it is required to have different sound-effect settings at different timing in order to achieve a better effect, so if there is no sound-effect coordination between two apparatuses when the music is switched from one of the apparatuses to the other, it will be impossible to guarantee the effect of sound-effect processing. Consequently, the user's experience will be greatly degraded.

SUMMARY OF THE INVENTION

In view of this, the present disclosure provides a sound-effect setting method and an associated electronic device.

According to an embodiment of the present disclosure, the present disclosure provides a sound-effect setting method. The method comprises: decoding an audio data stream; performing sound-effect processing on the decoded audio data stream according to a sound-effect parameter to obtain sound-effect processed audio data; encoding the sound-effect processed audio data to obtain encoded data; and outputting the encoded data and the sound-effect parameter.

According to another embodiment of the present disclosure, the present disclosure provides a sound-effect setting method. The method comprises: receiving input data, wherein the input data comprises audio data and a sound-effect parameter; decoding the audio data; and setting a sound-effect of the decoded audio data according to the sound-effect parameter.

According to still another embodiment of the present disclosure, the present disclosure provides an electronic device. The electronic device comprises a decoding module, a sound-effect processing module, an encoding module and a communication module. The decoding module is configured to decode an audio data stream. The sound-effect processing module is configured to perform sound-effect processing on the audio data stream decoded by the decoding module according to a sound-effect parameter to obtain sound-effect processed audio data. The encoding module is configured to encode the sound-effect processed audio data from the sound-effect processing module to obtain encoded data. The communication module is configured to output the encoded data encoded by the encoding module and the sound-effect parameter.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION OF THE INVENTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
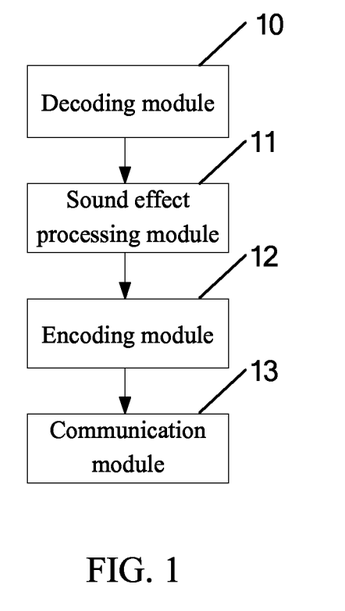
FIG. 1 is a schematic structural view of an electronic device according to a first embodiment of the present disclosure.

FIG. 1 is a schematic structural view of an electronic device according to a first embodiment of the present disclosure. As shown in FIG. 1, the device comprises a decoding module 10, a sound-effect processing module 11, an encoding module 12 and a communication module 13.

The decoding module 10 is configured to decode an audio data stream.

The sound-effect processing module 11 is coupled to the decoding module 10, and is configured to perform sound-effect processing on the audio data stream decoded by the decoding module 10 according to a sound-effect parameter to obtain sound-effect processed audio data.

The encoding module 12 is coupled to the sound-effect processing module 11, and is configured to encode the sound-effect processed audio data from the sound-effect processing module 11 to obtain encoded data.

The communication module 13 is coupled to the encoding module 12, and is configured to output the encoded data and the sound-effect parameter.

Figure 2:
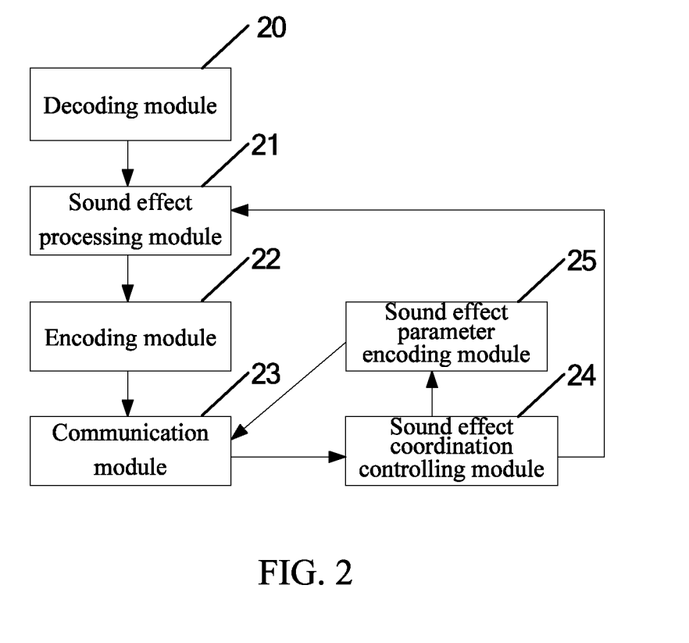
FIG. 2 is a schematic structural view of an electronic device according to a second embodiment of the present disclosure.

FIG. 2 is a schematic structural view of an electronic device according to a second embodiment of the present disclosure. As shown in FIG. 2, the device comprises a decoding module 20, a sound-effect processing module 21, an encoding module 22, a communication module 23, a sound-effect coordination controlling module 24 and a sound-effect parameter encoding module 25.

The communication module 23 firstly establishes a connection with an external apparatus (not shown), then transmits a sound-effect querying request, which is used to query the current preset sound-effect parameter of the external apparatus, to the external apparatus, and subsequently receives response information for the sound-effect querying request.

The sound-effect coordination controlling module 24 is coupled to the communication module 23, and configured to determine the sound effect that should be coordinated between the current apparatus (i.e., the electronic device according to the second embodiment of the present disclosure) and the external apparatus according to the response information received by the communication module 23, in order to generate the sound-effect parameter. Specifically, the sound-effect coordination controlling module 24 determines the sound-effect parameter according to sound-effect parameter setting rules, and the sound-effect parameter comprises a target sound-effect parameter necessary for a sound effect that should be coordinated by the external apparatus and a source sound-effect parameter necessary for a sound effect that should be coordinated by the current apparatus. Specifically, the sound-effect parameter setting rules comprise the following rules. R1: regardless of the sound-effect setting of the current apparatus, set the target sound-effect parameter to be the preset sound-effect parameter of the external apparatus. R2: regardless of the sound-effect setting of the external apparatus, set the source sound-effect parameter to be the preset sound-effect parameter of the external apparatus. R3: the current apparatus and the external apparatus cooperate to perform sound-effect processing. In rule R3, the combined effect achieved by sound-effect processing preformed by the current apparatus according to the source sound-effect parameter and sound-effect processing performed by the external apparatus according to the target sound-effect parameter, is identical to the effect achieved by sound-effect processing performed by the current apparatus according to the preset sound-effect parameter thereof or the effect achieved by sound-effect processing performed by the external apparatus according to the preset sound-effect parameter thereof.

The decoding module 20 is configured to decode an audio data stream.

The sound-effect processing module 21 is coupled to the decoding module 20 and the sound-effect coordination controlling module 24 respectively, and is configured to perform sound-effect processing on the audio data stream decoded by the decoding module 20 according to the sound-effect parameters generated by the sound-effect coordination controlling module 24, to obtain the sound-effect processed audio data. Specifically, the sound-effect processing module 21 performs sound-effect processing on the audio data stream decoded by the decoding module 20 according to the source sound-effect parameter generated by the sound-effect coordination controlling module 24, to obtain the sound-effect processed audio data.

The encoding module 22 is coupled to the sound-effect processing module 21, and configured to encode the sound-effect processed audio data from the sound-effect processing module 21 to obtain encoded data. Specifically, the encoding module 22 encodes the sound-effect processed audio data to obtain the audio formats of encoded data supported by the external apparatus.

The sound-effect parameter encoding module 25 is coupled to the sound-effect coordination controlling module 24 and configured to encode the sound-effect parameter.

The communication module 23 is coupled to the encoding module 22 and the sound-effect parameter encoding module 25, and configured to transmit the encoded data encoded by the encoding module 22 and the sound-effect parameter encoded by the sound-effect parameter encoding module 25 to the external apparatus. Specifically, the communication module 23 transmits the encoded data, which has been sound-effect processed with the source sound-effect parameter, and the target sound-effect parameter encoded by the sound-effect parameter encoding module 25 to the external apparatus, respectively.

Figure 3:
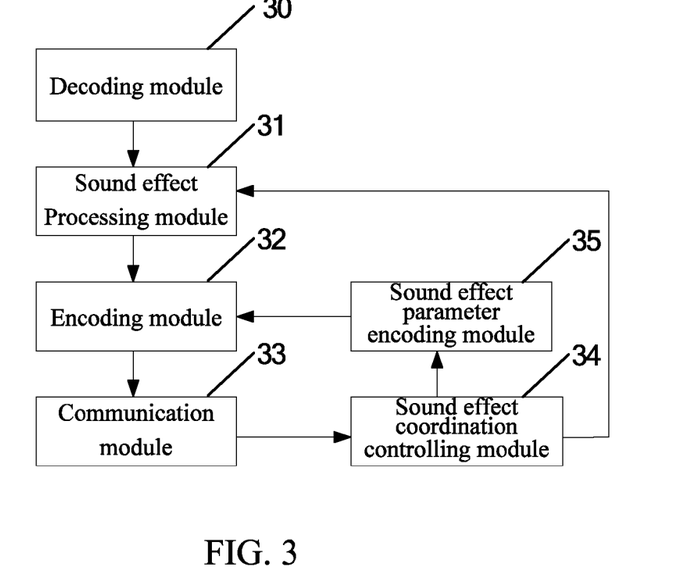
FIG. 3 is a schematic structural view of an electronic device according to a third embodiment of the present disclosure.

FIG. 3 is a schematic structural view of an electronic device according to a third embodiment of the present disclosure. As shown in FIG. 3, the device comprises a decoding module 30, a sound-effect processing module 31, an encoding module 32, a communication module 33, a sound-effect coordination controlling module 34 and a sound-effect parameter encoding module 35.

The communication module 33 firstly establishes a connection with an external apparatus, then transmits to the external apparatus a sound-effect querying request for querying the current preset sound-effect parameter of the external apparatus, and subsequently receives response information for the sound-effect querying request.

The sound-effect coordination controlling module 34 is coupled to the communication module 33, and configured to determine the sound effect that should be coordinated between the current apparatus (i.e., the electronic device according to the third embodiment of the present disclosure) and the external apparatus according to the response information and generate a sound-effect parameter. Specifically, the sound-effect coordination controlling module 34 determines the sound-effect parameter according to sound-effect parameter setting rules, and the sound-effect parameter comprises a target sound-effect parameter necessary for the sound effect that should be coordinated by the external apparatus and a source sound-effect parameter necessary for the sound effect that should be coordinated by the current apparatus. Specifically, the sound-effect parameter setting rules comprise the following rules. R1: regardless of the sound-effect setting of the current apparatus, set the target sound-effect parameter to be the preset sound-effect parameter of the external apparatus. R2: regardless of the sound-effect setting of the external apparatus, set the source sound-effect parameter to be the preset sound-effect parameter of the external apparatus. R3: the current apparatus and the external apparatus cooperate to perform sound-effect processing. In rule R3, the combined effect achieved by sound-effect processing preformed by the current apparatus according to the source sound-effect parameter and sound-effect processing performed by the external apparatus according to the target sound-effect parameter, is identical to the effect achieved by sound-effect processing performed by the current apparatus according to the preset sound-effect parameter thereof or the effect achieved by sound-effect processing performed by the external apparatus according to the preset sound-effect parameter thereof.

The decoding module 30 is configured to decode an audio data stream.

The sound-effect processing module 31 is coupled to the decoding module 30 and the sound-effect coordination controlling module 34 respectively, and configured to perform sound-effect processing on the audio data stream decoded by the decoding module 30 according to the sound-effect parameters generated by the sound-effect coordination controlling module 34, to obtain sound-effect processed audio data. Specifically, the sound-effect processing module 31 performs sound-effect processing on the audio data stream decoded by the decoding module 30 according to the source sound-effect parameter generated by the sound-effect coordination controlling module 34, to obtain the sound-effect processed audio data.

The encoding module 32 is coupled to the sound-effect processing module 31, and configured to encode the sound-effect processed audio data from the sound-effect processing module 31 to obtain encoded data. Specifically, the encoding module 32 encodes the audio data that has been sound-effect processed with the source sound-effect parameter to obtain the audio formats of encoded data supported by the external apparatus.

The sound-effect parameter encoding module 35 is coupled to the sound-effect coordination controlling module 34 and configured to encode the sound-effect parameter. Specifically, the sound-effect parameter encoding module 35 is configured to encode the target sound-effect parameter.

The encoding module 32 is further coupled to the sound-effect parameter encoding module 35, and configured to insert the sound-effect parameter encoded by the sound-effect parameter encoding module 35 into the encoded data. Specifically, the encoding module 32 inserts the encoded sound-effect parameter between audio data frames of the encoded data; or inserts the encoded sound-effect parameter into a user-definable field of an audio frame of the encoded data; or inserts the encoded sound-effect parameter between the encoded data of different tracks.

The communication module 33 is coupled to the encoding module 32, and configured to transmit the encoded data with the sound-effect parameter inserted therein to the external apparatus.

Figure 4:
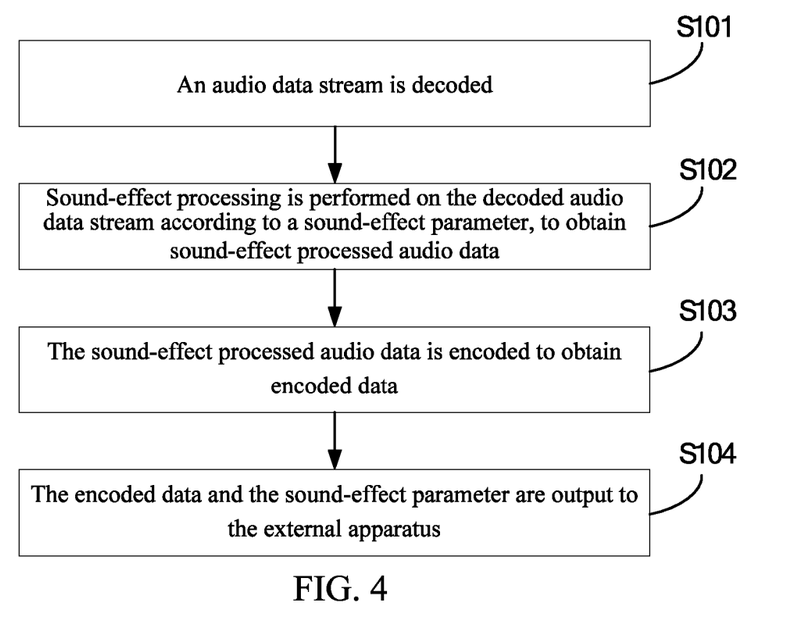
FIG. 4 is a flowchart diagram of a sound-effect setting method according to the first embodiment of the present disclosure.

FIG. 4 is a flowchart diagram of a sound-effect setting method according to the first embodiment of the present disclosure. It should appreciate that, provided substantially the same result can be obtained, the method of the present disclosure is not limited to the step sequence shown in FIG. 4. As shown in FIG. 4, the sound-effect setting method according to this embodiment is described by taking the current apparatus as an example, and the method comprises the following steps.

In step S101, an audio data stream is decoded. The audio data stream may be different formats of audio files, such as an AAC audio file, an MP3 audio file, an FLAC audio file. Decoding the audio data stream is to decode the different formats of audio files to acquire audio signals available for playing.

In step S102, sound-effect processing is performed on the decoded audio data stream according to a sound-effect parameter, to obtain sound-effect processed audio data. The sound-effect parameter is used for the sound effect that should be coordinated between the current apparatus and an external apparatus. Performing sound-effect processing on the decoded audio data according to the sound-effect parameter can prevent the playing effect from being degraded due to lack of sound-effect coordination when the audio played by the current apparatus is switched to the external apparatus.

As an example, the current apparatus is a cell phone, the target apparatus is an on-board player, and the sound-effect setting is made by an equalizer. Assuming the equalization mode on the cell phone is "Rock" and the equalization mode on the on-board player is "Popular", then the sound effect obtained by combining together the two kinds sound will necessarily become disrupted, thus degrading the playing sound effect. In this case, according to step S102, the audio data is processed according to the sound effect that should be coordinated between the current apparatus and the external apparatus before to be played, so that the sound-effect coordination between the current apparatus and the external apparatus can be achieved and the playing effect required by the user is obtained.

In step S103, the sound-effect processed audio data is encoded to obtain encoded data. Specifically, the audio data is encoded to obtain the encoded data of the audio formats supported by the external apparatus. Those skilled in the art can understand that, the audio data stream in step S101 and the encoded data in step S103 may be different formats of audio files. For example, the format of the audio data stream in step S101 is MP3, which is an audio format that can be played by the current apparatus. The format of the encoded data in step S103 is AAC, which is an audio format that can be played by the target apparatus. Of course, those skilled in that art can understand that, the audio data stream in step S101 and the encoded data in step S103 may be audio files of the same format. For example, both the format of the audio data stream in step S101 and the format of the encode data in step S103 are MP3, which is an audio format that can be played by both the current apparatus and the target apparatus.

In step S104, the encoded data and the sound-effect parameter are output to the external apparatus. Specifically, the encoded data and the sound-effect parameter are combined into one data stream and then the one data stream is output to the external apparatus. Alternatively, the encoded data and the sound-effect parameter are output to the external apparatus as two separate data streams, respectively.

According to steps of the sound-effect setting method of the first embodiment of the present disclosure, the sound-effect coordination is achieved when the audio played by the current apparatus is switched to be played by an external apparatus, thus preventing the playing effect from being degraded due to lack of sound-effect coordination. It should appreciate that, the current apparatus and the external apparatus set forth in this specification can be switched with each other. That is, either of the two apparatuses may be the current apparatus or the external apparatus.

Figure 5:
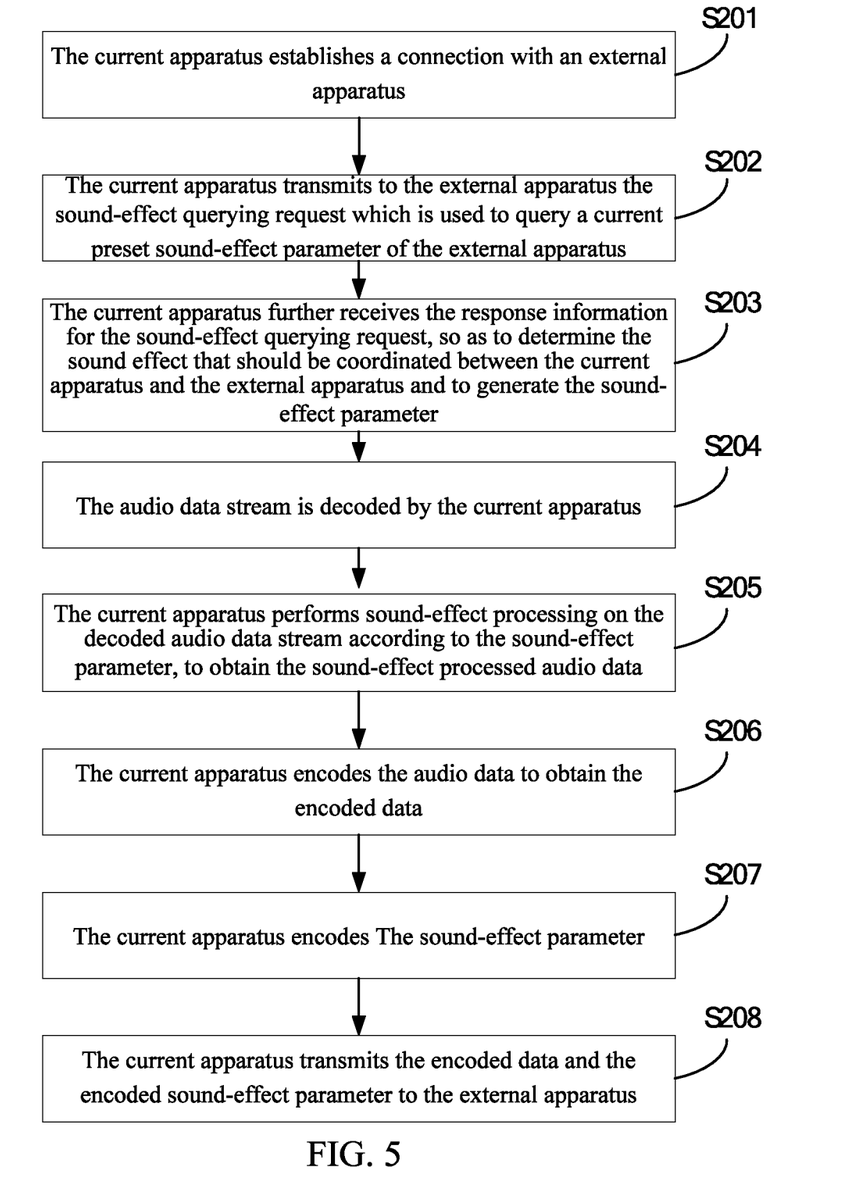
FIG. 5 is a flowchart diagram of a sound-effect setting method according to the second embodiment of the present disclosure.

FIG. 5 is a flowchart diagram of a sound-effect setting method according to the second embodiment of the present disclosure. It should appreciate that, provided substantially the same result can be obtained, the method of the present disclosure is not limited to the step sequence shown in FIG. 5. As shown in FIG. 5, the sound-effect setting method of this embodiment is described by taking the current apparatus as an example. The method comprises the following steps.

In step S201, the current apparatus establishes a connection with an external apparatus. The connection between the external apparatus and the current apparatus may be a wired connection (e.g., a USB connection) or a wireless connection. Specifically, the wireless connection may be Bluetooth connection, WIFI connection, Miracast connection, etc.

Taking the wireless connection being Miracast connection as an example, after the current apparatus establishes connection with the external apparatus, the information communication between the current apparatus and the external apparatus is achieved mainly through controlling streams and data streams.

In step S202, the current apparatus transmits to the external apparatus the sound-effect querying request which is used to query a current preset sound-effect parameter of the external apparatus.

Taking the wireless connection being Miracast connection as an example, the sound-effect querying request may be transmitted from the current apparatus to the external apparatus through a controlling stream of Miracast. Specifically, the sound-effect querying of the current apparatus to the external apparatus may be achieved through the Device Capability Negotiation or the remote $I^2C$ read-write of the RTSP protocol in Miracast.

In step S203, after transmitting the sound-effect querying request to the external apparatus in step S202, the current apparatus further receives the response information for the sound-effect querying request, so as to determine the sound effect that should be coordinated between the current apparatus and the external apparatus and to generate the sound-effect parameters. Specifically, the current apparatus obtains the current preset sound-effect parameter of the external apparatus, and determines the sound effect that should be coordinated between the current apparatus and the external apparatus by comparing the current preset sound-effect parameter of the external apparatus with the current preset sound-effect parameter of the current apparatus.

For example, the current apparatus is a cell phone and the target apparatus is an on-board player, and the sound effect that should be coordinated between the current apparatus and the external apparatus may be set by an equalizer or through gain adjustment.

In step S203, the sound-effect parameter is determined according to sound-effect parameter setting rules. The sound-effect parameter comprises a target sound-effect parameter necessary for the sound effect that should be coordinated by the external apparatus and a source sound-effect parameter necessary for the sound effect that should be coordinated by the current apparatus.

The sound-effect parameter setting rules at least comprise the following three rules.

R1: regardless of the sound-effect setting of the current apparatus, set the target sound-effect parameter to be the preset sound-effect parameter of the external apparatus.

For R1, for example, the current apparatus is a cell phone, the external apparatus is an on-board player, and the sound-effect setting is made by an equalizer. It is assumed that the music enjoyed by the user is played in "Rock" equalization mode on the cell phone and the equalization mode set on the on-board player is "Popular". Then the "Rock" equalization mode on the cell phone is turned off (i.e., regardless of the sound-effect setting of the current apparatus) and the target sound-effect parameter is set to be the "Popular" equalization mode. That is, when the rule R1 is used, the sound-effect processing is only performed by the external apparatus, and the target sound-effect parameter is the preset sound-effect parameter of the external apparatus.

R2: regardless of the sound-effect setting of the external apparatus, set the source sound-effect parameter to be the preset sound-effect parameter of the external apparatus.

For R2, for example, the current apparatus is a cell phone, the target apparatus is an on-board player, and the sound-effect setting is made by an equalizer. Assume the music enjoyed by the user is played in "Rock" equalization mode on the cell phone and the equalization mode set on the on-board player is "Popular". Then the "Popular" equalization mode on the on-board player is turned off (i.e., regardless of the sound-effect setting of the external apparatus) and the source sound-effect parameter is set to be the "Popular" equalization mode. That is, when using the rule R2, the sound-effect processing is only performed by the current apparatus and the source sound-effect parameter is the preset sound-effect parameter of the external apparatus.

R3: the current apparatus and the external apparatus cooperate to perform sound-effect processing. And the effect achieved by sound-effect processing performed by the current apparatus according to the source sound-effect parameter and sound-effect processing performed by the external apparatus according to the target sound-effect parameter, is identical to the effect achieved by sound-effect processing performed by the current apparatus according to the preset sound-effect parameter thereof or achieved by sound-effect processing performed by the external apparatus according to the preset sound-effect parameter thereof.

For R3, as an example, the current apparatus is a cell phone, the target apparatus is an on-board player and the sound-effect setting is made through the gain adjustment. Assume that the user adjusts the gain to +12 dB in 1 KHz frequency band through the setting of segmented equalizer of the cell phone. Then the source sound-effect parameter and the target sound-effect parameter are set such that a sum of the gains in the 1 KHz frequency band achieved through the source sound-effect parameter and the target sound-effect parameter respectively is +12 dB. For example, the source sound-effect parameter is set such that the gain in the 1 KHz frequency band achieved through the source sound-effect parameter is +3 dB, and the target sound-effect parameter is set such that the gain in the 1 KHz frequency band achieved through the target sound-effect parameter is set to be +9 dB. As another example, assume the user adjusts the gain to −12 dB in 1 KHz frequency band through the setting of the segmented equalizer of the on-board player. Then the source sound-effect parameter and the target sound-effect parameter are set such that a sum of the gains in the 1 KHz frequency band achieved through the source sound-effect parameter and the target sound-effect parameter respectively is −12 dB. For example, the source sound-effect parameter is set such that the gain in 1 KHz frequency band achieved through the source sound-effect parameter is −3 dB, and the target sound-effect parameter is set such that the gain in the 1 KHz frequency band achieved through the target sound-effect parameter is −9 dB. That is, when the rule R3 is used, the current apparatus and the external apparatus cooperate to perform sound-effect processing, and the source sound-effect parameter and the target sound-effect parameter can be set depending on the practical situation as long as they could satisfy the constraint of the rule R3.

In step S204, the audio data stream is decoded by the current apparatus. Specifically, the current apparatus decodes an audio file to acquire audio signals for playing.

In step S205, the current apparatus performs sound-effect processing on the decoded audio data stream according to the sound-effect parameters, to obtain the sound-effect processed audio data. Specifically, the sound-effect processing is performed on the decoded audio data stream according to the source sound-effect parameter to obtain the sound-effect processed audio data.

For the rule R1, since the sound-effect setting of the current apparatus is bypassed, the audio data that has been sound-effect processed remains the same as the audio data before the sound-effect processing.

For the rule R2, since the source sound-effect parameter is set to be the preset sound-effect parameter of the external apparatus, the audio data that has been sound-effect processed is the audio data obtained through processing with the preset sound-effect parameter of the external apparatus.

For the rule R3, the audio data that has been sound-effect processed is the audio data obtained through processing with the source sound-effect parameter. The source sound-effect parameter is not a definite value, but may be set depending on the practical situation as long as it could satisfy the constraint in the rule R3.

In step S206, the current apparatus encodes the audio data to obtain the encoded data. The audio data that is obtained through the sound-effect processing with the source sound-effect parameter is encoded to obtain audio format of encoded data supported by the external apparatus.

In step S207, the current apparatus encodes the sound-effect parameter. Specifically, the target sound-effect parameter is encoded with an encoding format that can be identified by the external apparatus.

The specific structure of the encoded sound-effect parameter is shown as follows:

| Fixed identification ID | Classification code | Chip ID | Apparatus ID | Sound-effect category | Parameter data type | Parameter data | Check code |
|---|---|---|---|---|---|---|---|

In the above structure, the encoded sound-effect parameter comprises a fixed identification ID, a classification code, a chip ID, an apparatus ID, a sound-effect category, a parameter data type, parameter data and a check code. Specifically, the fixed identification ID is used to identify the encoding structure as a sound-effect parameter code. The classification code is used to distinguish the type of the external apparatus, such as a car, a pad, a TV set, and a phone. The chip ID indicates the model of the audio chip used in the external apparatus. The apparatus ID indicates the model of the external apparatus. The sound-effect category indicates sound-effect processing functions that should be coordinated, such as the equalization (EQ), the reverb, the master volume and the upmix. The parameter data type corresponds to the sound-effect category, and comprises parameter types that need a response and that do not need a response. The parameter data also corresponds to the sound-effect category. For example, when the sound-effect category is equalization, the parameter data may be "Popular", "Rock", etc. Of course, those skilled in the art can understand that, the above encoding formats are only for purpose of illustration rather than to limit the present disclosure.

In step S208, the current apparatus transmits the encoded data and the encoded sound-effect parameter to the external apparatus. Specifically, the encoded data that has been sound-effect processed with the source sound-effect parameter and the encoded target sound-effect parameter are transmitted to the external apparatus respectively.

Taking the wireless connection being Miracast connection as an example, the communication of the encoded data and the encoded sound-effect parameter between the current apparatus and the external apparatus may be achieved through data streams of Miracast.

According to the above implementations, with the sound-effect setting method according to the second embodiment of the present disclosure, the current apparatus transmits a sound-effect querying request to the external apparatus to determine the sound effect that should be coordinated between the current apparatus and the external apparatus and generate sound-effect parameters. The sound-effect parameters comprise a target sound-effect parameter necessary for the sound effect that should be coordinated by the external apparatus and a source sound-effect parameter necessary for the sound effect that should be coordinated by the current apparatus. Then, the current apparatus outputs the target sound-effect parameter and the audio data that has been sound-effect processed according to the source sound-effect parameter to the external apparatus respectively. Thereby, when the audio playing is switched from the current apparatus to the external apparatus, the sound-effect coordination is achieved, thus preventing the playing effect from becoming poor due to lack of sound-effect coordination.

Figure 6:
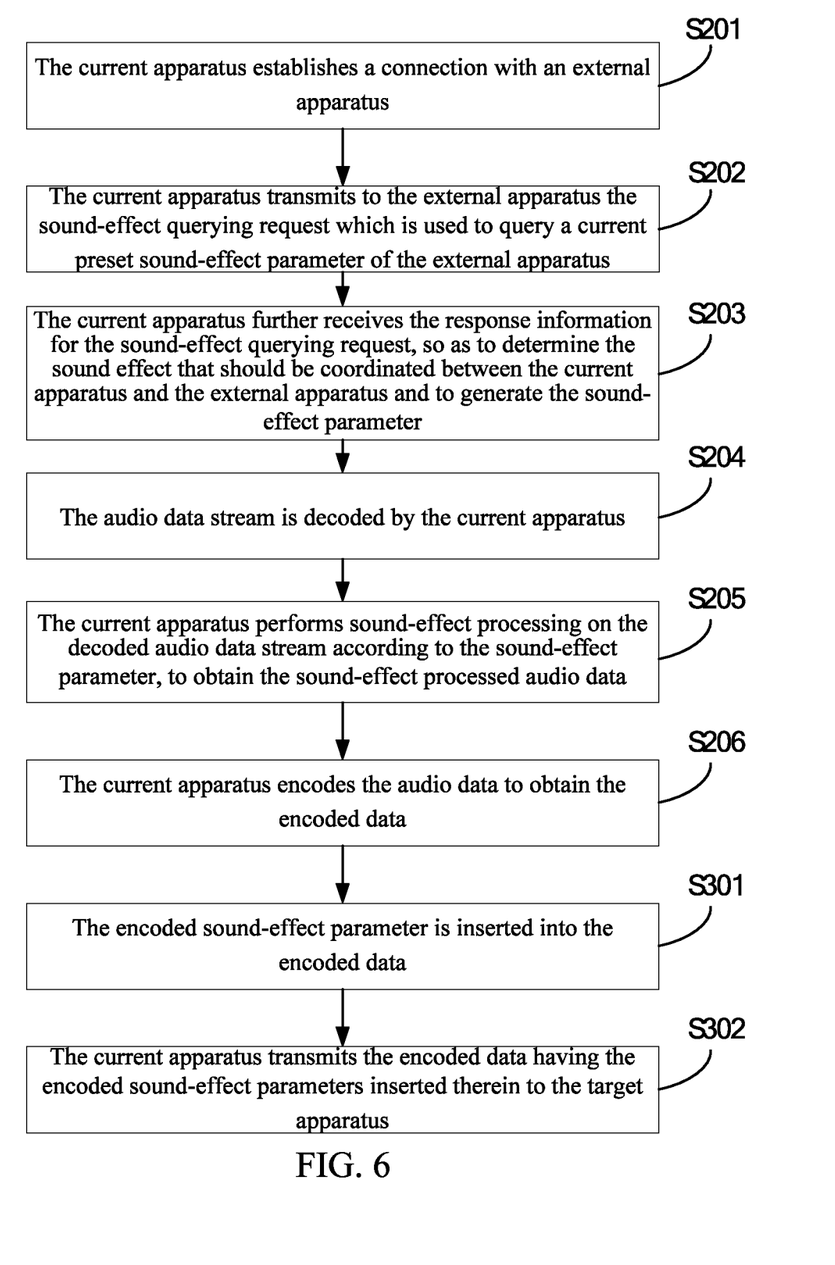
FIG. 6 is a flowchart diagram of a sound-effect setting method according to the third embodiment of the present disclosure.

FIG. 6 is a flowchart diagram of a sound-effect setting method according to a third embodiment of the present disclosure. It should be appreciated that, provided that substantially the same result can be obtained, the method of the present disclosure is not limited to the step sequence shown in FIG. 6.

As shown in FIG. 6, FIG. 6 differs from the second embodiment shown in FIG. 5 mainly in that:

After step S206, FIG. 6 further comprises the following steps.

In step S301, the encoded sound-effect parameter is inserted into the encoded data. There are at least the following three modes to insert the encoded sound-effect parameter into the encoded data to form new encoded data.

Mode 1: insert the encoded sound-effect parameter between audio data frames of the encoded data to form the new encoded data.

In mode 1, the specific structures of the original encoded data and the new encoded data are shown as follows:

In the above structure, the original encoded data comprises a plurality of audio data frames (Audio Frame). The new encoded data is formed by inserting a sound-effect encoded data frame (SoundEffect Frame) between the audio data frame 1 and the audio data frame 2 of the original encoded data. The sound-effect encoded data frame comprises the encoded sound-effect parameter. Preferably, the length of the inserted sound-effect encoded data frame is the same as the length of the audio data frame. Those skilled in the art can understand, it is only for purpose of illustration to position the sound-effect encoded data frame between the audio data frame 1 and the audio data frame 2, rather than to limit the present disclosure. Alternatively, the sound-effect encoded data frame may also be positioned between other audio data frames or before/after other audio data frames.

In practical use, taking the audio data frame being an AAC data frame as an example, the specific structures of the original encoded data and the new encoded data are shown as follows:

In the above structure, the original encoded data comprises a plurality of AAC audio data frames, each of which comprises a frame header, a channel pair element (CPE) and a terminator (TERM). The new encoded data is formed by inserting the sound-effect encoded data frame (SoundEffect Frame) between the TERM of the audio data frame 1 and the frame header of the audio data frame 2 of the original encoded data. The sound-effect encoded data frame comprises a sound-effect encoded data frame header (SoundEffect Frame Header), a fill element (FIL) and a terminator (TERM). Specifically, the FIL comprises a fill element identifier (ID_FIL), a length (Length) of the FIL and an extension payload element (extension_payload). The extension payload element comprises an extension type and an encoded sound-effect parameter (SoundEffect_data) and the extension type indicates the sound-effect parameter (EXT_SE_DATA).

By adopting the mode 1 to insert the encoded sound-effect parameter between the audio data frames, the total number of frames of the encoded data will be increased, in which the encoded sound-effect parameter forms a separate sound-effect encoded data frame. When a decoder is incapable of decoding the sound-effect encoded data frame, the frame can be simply discarded without affecting the decoding and the playing of the audio data frames in the encoded data.

Mode 2: insert the encoded sound-effect parameter into a user-definable field of an audio data frame of the encoded data.

In mode 2, the specific structures of the original encoded data and the new encoded data are shown as follows:

In the above structure, the original encoded data comprises a plurality of audio data frames (Audio Frame). The new encoded data is formed by inserting the encoded sound-effect parameter into the user-definable field of the audio data frame 1 of the encoded data. The length of the audio data frame 1 in the new encoded data is longer than the length of the audio data frame 1 in the original encoded data, and the length of the other audio data frames remains unchanged. Those skilled in the art can understand that, positioning the sound-effect encoded data frame in the user-definable field of the audio data frame 1 is only for purpose of illustration rather than to limit the present disclosure.

In practical use, taking the audio data frame being AAC data frame as an example, the specific structures of the original encoded data and the new encoded data are shown as follows:

In the above structure, the original encoded data comprises a plurality of AAC audio data frames, each of which comprises a frame header, a channel pair element (CPE) and a terminator (TERM). The new encoded data is formed by inserting a fill element (FIL) into a user-definable field of the channel pair element of the original encoded data. Specifically, the FIL comprises a fill element identifier (ID_FIL), a length (Length) of the fill element and an extension payload element (extension_payload). The extension payload element comprises an extension type and an encoded sound-effect parameter (SoundEffect data), and the extension type indicates the sound-effect parameter (EXT_SE_DATA). The frame header of the AAC audio data frame comprises a synchronization word (SyncWord), an audio data frame length (FrameLength) and a check code (CRC). After the encoded sound-effect parameter is inserted into the channel pair element, the information in the audio data frame length and the CRC need to be changed correspondingly.

In practical use, taking the audio data frame being the MP3 data frame as an example, the specific structures of the original encoded data and the new encoded data are shown as follows:

In the above structure, the original encoded data comprises a plurality of MP3 audio data frames, each of which comprises a header (Header), a check code (CRC), a side information element (Side Information), a main data element (Main Data) and an ancillary data element (Ancillary Data). The new encoded data is formed by inserting the encoded sound-effect parameter (SoundEffect_data) into the ancillary data element of the original encoded data. Specifically, the ancillary data element is provided for the user to define information (e.g., such additional information as the title of music, the artist and the album title) that he or she desires to record. Additionally, after the encoded sound-effect parameter is inserted into the ancillary data element, the header of the MP3 audio data frame and the information in the CRC need to be changed correspondingly.

By adopting mode 2 to insert the encoded sound-effect parameter into the audio data frame, the total number of frames of the encoded data will not be increased, but the length of the audio data frame having the encoded sound-effect parameter inserted therein will change. The information on the length of the audio data frame and the CRC will change correspondingly. Only when such information is updated correspondingly, can normal decoding of the encoded sound-effect parameter be guaranteed.

Mode 3: insert the encoded sound-effect parameter between the encoded data of different tracks.

In mode 3, the specific structures of the original encoded data and the new encoded data are shown as follows:

In the above structure, the original encoded data comprises a plurality of tracks; and the new encoded data is formed by inserting the encoded sound-effect parameters between the encoded data of the different tracks. Preferably, the encoded sound-effect parameters are different from each other. By adopting mode 3, the sound-effect parameters can be updated simultaneously when the tracks are changed.

Those skilled in the art can understand that, in other embodiments where the original encoded data is an audio data stream, the encoded sound-effect parameter may also be inserted into the audio data stream at different time points so that the sound-effect parameter can change dynamically to achieve the function of Auto DJ. Preferably, when the different encoded sound-effect parameters are inserted into the audio data stream at different time points, the sound-effect parameters may carry presentation time stamps (PTS) so that the sound-effect parameters can be updated at precise time points when the audio data stream is being decoded.

In step S302, the current apparatus transmits the encoded data having the encoded sound-effect parameters inserted therein to the target apparatus. Specifically, after inserting the encoded target sound-effect parameters into the encoded data sound-effect processed according to the source sound-effect parameter, the current apparatus transmits the data stream thus formed to the target apparatus.

According to the above implementations, with the sound-effect setting method according to the third embodiment of the present disclosure, the current apparatus can transmit a sound-effect querying request to the external apparatus so as to determine the sound effect that should be coordinated between the current apparatus and the external apparatus and to generate sound-effect parameters. The sound-effect parameters comprise a target sound-effect parameter necessary for the sound effect that should be coordinated by the external apparatus and a source sound-effect parameter necessary for the sound effect that should be coordinated by the current apparatus. Then, the current apparatus inserts the target sound-effect parameter into the audio data that that has been sound-effect processed according to the source sound-effect parameter to form a separate data stream and then outputs the data stream to the external apparatus. Thereby, when the music playing is switched from the current apparatus to the external apparatus, the sound-effect coordination is achieved, thus preventing the playing effect from becoming poor due to lack of sound-effect coordination.

Figure 7:
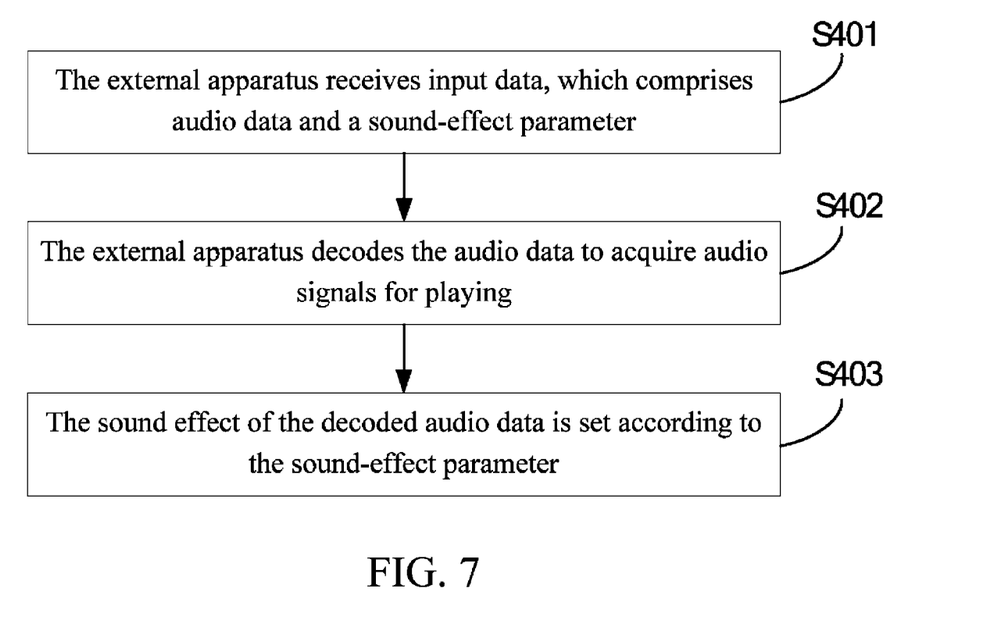
FIG. 7 is a flowchart diagram of a sound-effect setting method according to a fourth embodiment of the present disclosure.

FIG. 7 is a flowchart diagram of a sound-effect setting method according to a fourth embodiment of the present disclosure. It should be appreciated that, provided that substantially the same result can be achieved, the method of the present disclosure is not limited to the step sequence shown in FIG. 7. As shown in FIG. 7, the sound-effect setting method of this embodiment is described by taking an external apparatus as an example. The method comprises the following steps.

In step S401, the external apparatus receives input data, which comprises audio data and a sound-effect parameter.

The external apparatus receives the input data transmitted by a current apparatus. The input data may be a separate data stream, which is formed by combining the audio data and the sound-effect parameter together. Alternatively, the input data may also be two separate data streams, which are formed by the audio data and the sound-effect parameter respectively. The current apparatus decodes audio and video code streams, performs sound-effect processing on the decoded audio and video code streams according to the sound-effect parameter, subsequently encodes the decoded audio and video code streams that have been sound-effect processed, and then obtains the audio data. The sound-effect parameter is provided for the sound effect that should be coordinated between the current apparatus and the external apparatus.

In step S402, the external apparatus decodes the audio data to acquire audio signals for playing.

In step S403, the sound-effect of the decoded audio data is set according to the sound-effect parameter, so that the problem that the playing effect will become poorer if there is no sound-effect coordination can be prevented when the music playing is switched from the current apparatus to the external apparatus.

According to the above implementations, with the sound-effect setting method of the fourth embodiment of the present disclosure, the audio data is decoded to acquire audio signals for playing and the sound-effect of the decoded audio data is set according to the sound-effect parameter. Thereby, the sound-effect coordination when the music playing is switched from the current apparatus to the external apparatus is achieved, and the problem that the playing effect will become poorer if there is no sound-effect coordination is prevented.

Figure 8:
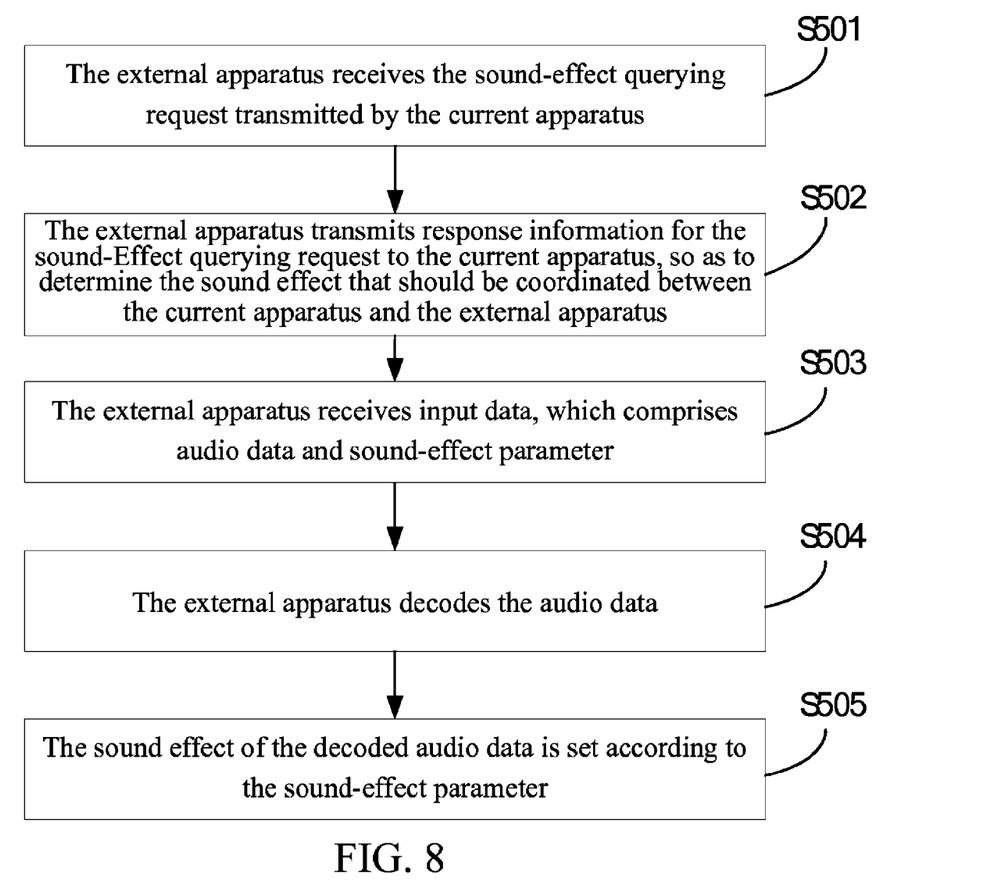
FIG. 8 is a flowchart diagram of a sound-effect setting method according to a fifth embodiment of the present disclosure.

FIG. 8 is a flowchart diagram of a sound-effect setting method according to a fifth embodiment of the present disclosure. It should be appreciated that, provided that substantially the same result can be achieved, the method of the present disclosure is not limited to the step sequence shown in FIG. 8. As shown in FIG. 8, the sound-effect setting method of this embodiment is described by taking an external apparatus as an example, and comprises the following steps.

In step S501, the external apparatus receives the sound-effect querying request transmitted by a current apparatus; and the sound-effect querying request is used to query a current preset sound-effect parameter of the external apparatus.

In step S502, the external apparatus transmits response information for the sound-effect querying request to the current apparatus, so as to determine the sound effect that should be coordinated between the current apparatus and the external apparatus.

After the sound-effect querying request transmitted by the current apparatus is received by the external apparatus in step S501, the external apparatus transmits the response information for the sound-effect querying request so as to transmit the current preset sound-effect parameter thereof to the current apparatus. Then, the current apparatus can determine the sound effect that should be coordinated between the current apparatus and the external apparatus according to the current preset sound-effect parameter of the external apparatus and the current preset sound-effect parameter of the current apparatus so as to generate sound-effect parameter. The sound-effect parameter is obtained according to the sound-effect settings of the current apparatus and the external apparatus. Specifically, the sound-effect parameter comprises a target sound-effect parameter and a source sound-effect parameter. The target sound-effect parameter is a sound-effect parameter for the sound effect that has been confirmed by the current apparatus and should be coordinated by the external apparatus, and the source sound-effect parameter is a sound-effect parameter for the sound effect that has been confirmed by the current apparatus and should be coordinated by the current apparatus.

In step S503, the external apparatus receives input data, which comprises audio data and sound-effect parameter.

The input data comprising the audio data and the sound-effect parameter may be two separate data streams. Specifically, the sound-effect parameter is the target sound-effect parameter. The current apparatus decodes audio and radio code streams, performs sound-effect processing on the decoded audio and video code streams according to the source sound-effect parameter, subsequently encoding the decoded audio and video code streams that have been sound-effect processed, and then obtains the audio data.

In step S504, the external apparatus decodes the audio data.

Specifically, the external apparatus decodes the encoded audio data transmitted by the current apparatus to acquire audio signals for playing.

In step S505, the sound-effect of the decoded audio data is set according to the sound-effect parameter.

The external apparatus performs sound-effect processing on the decoded audio data according to the target sound-effect parameter so that the problem that the sound effect will become poorer if there is no sound-effect coordination when the music playing is switched from the current apparatus to the external apparatus can be prevented.

According to the above implementations, with the sound-effect setting method according to the fifth embodiment of the present disclosure, the external apparatus can transmit the response information for the sound-effect querying request to the current apparatus to determine the sound effect that should be coordinated between the current apparatus and the external apparatus. The external apparatus can also receive the audio data and the target sound-effect parameter transmitted by the current apparatus respectively, and set the sound-effect of the decoded audio data according to the target sound-effect parameter. Thereby, the sound-effect coordination when the audio playing is switched from the current apparatus to the external apparatus is achieved, and the problem that the effect will become poor if there is no sound-effect coordination is prevented.

Figure 9:
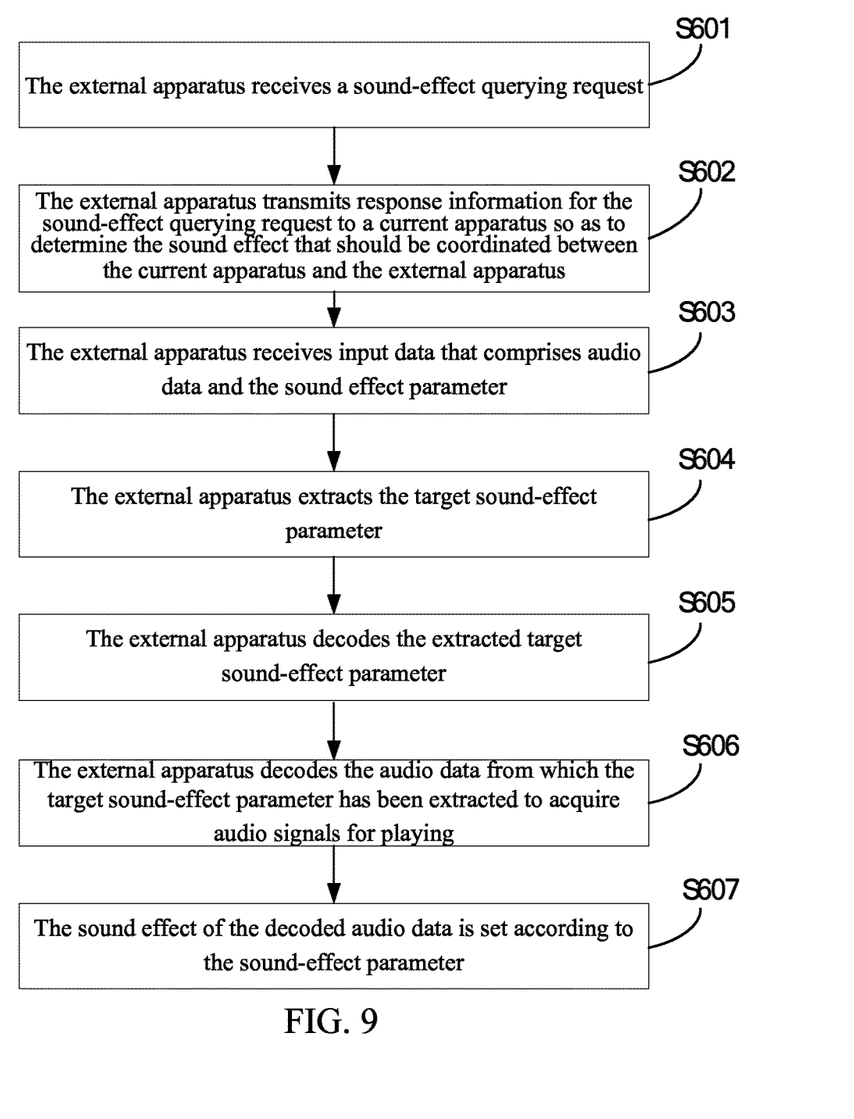
FIG. 9 is a flowchart diagram of a sound-effect setting method according to a sixth embodiment of the present disclosure.

FIG. 9 is a flowchart diagram of a sound-effect setting method according to a sixth embodiment of the present disclosure. It should be appreciated that, provided that substantially the same result can be obtained, the method of the present disclosure is not limited to the step sequence shown in FIG. 9. As shown in FIG. 9, the sound-effect setting method of this embodiment is described by taking an external apparatus as an example, and comprises the following steps:

In step S601, the external apparatus receives a sound-effect querying request.

In step S602, the external apparatus transmits response information for the sound-effect querying request to a current apparatus so as to determine the sound effect that should be coordinated between the current apparatus and the external apparatus.

Since step S601 and step S602 in this embodiment are similar to step S501 and step S502 in the fifth embodiment, they will not be further described herein for brevity.

In step S603, the external apparatus receives input data that comprises audio data and the sound-effect parameter.

In step S603, the input data comprising the audio data and the sound-effect parameter may be a separate data stream. Specifically, the sound-effect parameter is a target sound-effect parameter; and it is set into the audio data in the following three different manners: the target sound-effect parameter is set between the data frames of the audio data, or set into a user-definable field in a data frame of the audio data, or set between the audio data of different tracks.

In step S604, the external apparatus extracts the target sound-effect parameter.

The external apparatus extracts the target sound-effect parameter from the audio data. Specifically, corresponding to the three different manners in which the target sound-effect parameter is set into the audio data in the step S603, there are three different manners for extracting the target sound-effect parameter. The three different manners include extracting the target sound-effect parameter from between the data frames of the audio data, extracting the target sound-effect parameter from the user-definable field in a data frame of the audio data, and extracting the target sound-effect parameter from between the audio data of different tracks.

In step S605, the external apparatus decodes the extracted target sound-effect parameter.

In step S605, the target sound-effect parameter set into the audio data has been encoded by the current apparatus, so the external apparatus needs to decode the extracted target sound-effect parameter before directly using it.

In step S606, the external apparatus decodes the audio data from which the target sound-effect parameter has been extracted to acquire audio signals for playing.

In step S607, the sound-effect of the decoded audio data is set according to the sound-effect parameter.

Specifically, the external apparatus performs sound-effect processing on the decoded audio data according to the target sound-effect parameter so that when the audio playing is switched from the current apparatus to the external apparatus, the problem that the effect will become poor if there is no sound-effect coordination can be prevented.

According to the above implementations, with the sound-effect setting method according to the sixth embodiment of the present disclosure, the external apparatus can transmit the response information in response to the sound-effect querying request to the current apparatus to determine the sound effect that should be coordinated between the current apparatus and the external apparatus. The external apparatus can receive the data stream formed by combining the audio data and the target sound-effect parameter. The external apparatus can also extract the target sound-effect parameter from the audio data, and set the sound-effect of the decoded audio data according to the target sound-effect parameter. Thereby, the sound-effect coordination is achieved when the audio playing is switched from the current apparatus to the external apparatus, and the problem that the playing effect will become poorer if there is no sound-effect coordination is prevented.

In addition, it is apparent to those skilled in the art, the present disclosure also provides an electronic device, which comprises a non-transitory program storage medium and a processor. The non-transitory program storage medium stores a program executed by the processor to perform the method as described in above. Furthermore, it is apparent to those skilled in the art that, various modules 10, 11, 12, 13, 20, 21, 22, 23, 24, 25, 30, 31, 32, 33, 34, 35 as shown in FIGS. 1-3 may be software modules respectively. In another aspect, it is well-known that the above various software modules inherently are stored in the non-transitory program storage medium and executed by the processor to perform the method as described in above.

What described above are only the embodiments of the present disclosure, but are not intended to limit the scope of the present disclosure. Any equivalent structures or equivalent process flow modifications that are made according to the specification and the attached drawings of the present disclosure, or any direct or indirect applications of the present disclosure in other related technical fields shall all be covered within the protection scope of the present disclosure.

What is claimed is:

1. A sound-effect setting method, comprising:
    decoding an audio data stream;
    performing sound-effect processing on the decoded audio data stream according to a sound-effect parameter to obtain sound-effect processed audio data;
    encoding the sound-effect processed audio data to obtain encoded data; and
    outputting the encoded data and the sound-effect parameter.

2. The sound-effect setting method of claim 1, further comprising:
    establishing a connection with an external apparatus, wherein the sound-effect parameter is further used to set a sound effect of the external apparatus.

3. The sound-effect setting method of claim 2, further comprising:
    transmitting a sound-effect querying request to the external apparatus, wherein the sound-effect querying request is used to query a current preset sound-effect parameter of the external apparatus; and
    receiving response information for the sound-effect querying request, to determine a sound effect that should be coordinated between a current apparatus and the external apparatus and to generate the sound-effect parameter.

4. The sound-effect setting method of claim 3, wherein the step of generating the sound-effect parameter comprises:
    determining the sound-effect parameter according to sound-effect parameter setting rules, wherein the sound-effect parameter comprises a target sound-effect parameter necessary for a sound effect that shall be coordinated by the external apparatus and a source sound-effect parameter necessary for a sound effect that shall be coordinated by the current apparatus.

5. The sound-effect setting method of claim 4, wherein the sound-effect parameter setting rules comprises:
    regardless of the sound-effect setting of the current apparatus, setting the target sound-effect parameter to be the preset sound-effect parameter of the external apparatus; or
    regardless of the sound-effect setting of the external apparatus, setting the source sound-effect parameter to be the preset sound-effect parameter of the external apparatus; or
    the current apparatus and the external apparatus cooperating to perform sound-effect processing, wherein an effect achieved through sound-effect processing performed by the current apparatus according to the source sound-effect parameter and sound-effect processing performed by the external apparatus according to the target sound-effect parameter, is identical to an effect achieved through sound-effect processing performed by the current apparatus according to the preset sound-effect parameter of the current apparatus or through sound-effect processing performed by the external apparatus according to the preset sound-effect parameter of the external apparatus.

6. The sound-effect setting method of claim 1, further comprising:
    encoding the sound-effect parameter; and
    transmitting the encoded sound-effect parameter to an external apparatus.

7. The sound-effect setting method of claim 1, further comprising:
    encoding the sound-effect parameter;
    inserting the encoded sound-effect parameter into the encoded data; and
    transmitting the encoded data having the encoded sound-effect parameter inserted therein to an external apparatus.

8. The sound-effect setting method of claim 7, the step of inserting the encoded sound-effect parameter into the encoded data comprising:

inserting the encoded sound-effect parameter between audio data frames of the encoded data.

9. The sound-effect setting method of claim 7, the step of inserting the encoded sound-effect parameter into the encoded data comprising:
inserting the encoded sound-effect parameter into a user-definable field of an audio data frame of the encoded data.

10. The sound-effect setting method of claim 7, the step of inserting the encoded sound-effect parameter into the encoded data comprising:
inserting the encoded sound-effect parameter between the encoded data of different tracks.

11. A sound-effect setting method, comprising:
receiving input data, wherein the input data comprises audio data and a sound-effect parameter;
decoding the audio data;
setting a sound effect of the decoded audio data according to the sound-effect parameter;
receiving a sound-effect querying request, wherein the sound-effect query request is used to query a preset sound-effect parameter of a current apparatus; and
transmitting response information for the sound-effect querying request to an external apparatus so as to determine a sound effect that should be coordinated between the current apparatus and the external apparatus.

12. The sound-effect setting method of claim 11, wherein the sound-effect parameter comprises a target sound-effect parameter, which is a sound-effect parameter of the sound effect that should be coordinated by the current apparatus.

13. The sound-effect setting method of claim 12, further comprising:
extracting the target sound-effect parameter; and
decoding the extracted target sound-effect parameter.

14. The sound-effect setting method of claim 13, further comprising:
extracting the target sound-effect parameter from between data frames of the audio data.

15. The sound-effect setting method of claim 13, further comprising:
extracting the target sound-effect parameter from a user-definable field in a data frame of the audio data.

16. The sound-effect setting method of claim 13, further comprising:
extracting the target sound-effect parameter from between the audio data of different tracks.

17. The sound-effect setting method of claim 11, wherein the sound-effect parameter is obtained according to sound-effect settings of the current apparatus and the external apparatus.

18. An electronic device, comprising:
a decoding module, configured to decode an audio data stream;
a sound-effect processing module, coupled to the decoding module, and configured to perform sound-effect processing on the audio data stream decoded by the decoding module according to a sound-effect parameter to obtain sound-effect processed audio data;
an encoding module, coupled to the sound-effect processing module, and configured to encode the sound-effect processed audio data from the sound-effect processing module to obtain encoded data; and
a communication module, coupled to the encoding module, and configured to output the encoded data and the sound-effect parameter to an external apparatus.

19. The electronic device of claim 18, wherein the communication module establishes a connection with the external apparatus, the sound-effect parameter is further used to set the sound-effect of the external apparatus, and the electronic device further comprising:
a sound-effect coordination controlling module coupled to the communication module;
wherein the communication module transmits a sound-effect querying request to the external apparatus, and the sound-effect querying request is used to query a current preset sound-effect parameter of the external apparatus; the communication module receives response information for the sound-effect querying request; and
the sound-effect coordination controlling module is configured to determine a sound effect that should be coordinated between a current apparatus and the external apparatus according to the response information received by the communication module, and generate the sound-effect parameter;
a sound-effect parameter encoding module, configured to encode the sound-effect parameter;
wherein the communication module transmits the sound-effect parameter encoded by the sound-effect parameter encoding module to the external apparatus; or
the encoding module inserts the sound-effect parameter encoded by the sound-effect parameter encoding module into the encoded data, and the communication module transmits the encoded data having the encoded sound-effect parameter inserted therein to the external apparatus.

* * * * *